USO11895858B2

United States Patent
Aoki

(10) Patent No.: US 11,895,858 B2
(45) Date of Patent: Feb. 6, 2024

(54) DISPLAY DEVICE HAVING ORGANIC LIGHT EMITTING DIODE WITH LOW THRESHOLD LAYER

(71) Applicant: Japan Display Inc., Tokyo (JP)

(72) Inventor: Hayata Aoki, Tokyo (JP)

(73) Assignee: Japan Display Inc., Tokyo (JP)

( * ) Notice: Subject to any disclaimer, the term of this patent is extended or adjusted under 35 U.S.C. 154(b) by 100 days.

(21) Appl. No.: 17/481,351

(22) Filed: Sep. 22, 2021

(65) Prior Publication Data

US 2022/0115620 A1    Apr. 14, 2022

(30) Foreign Application Priority Data

Oct. 8, 2020    (JP) .................................. 2020-170394

(51) Int. Cl.
| | |
|---|---|
| H01L 51/50 | (2006.01) |
| H01L 27/32 | (2006.01) |
| H10K 50/17 | (2023.01) |
| H10K 50/15 | (2023.01) |
| H10K 59/122 | (2023.01) |

(52) U.S. Cl.
CPC ............. H10K 50/17 (2023.02); H10K 50/15 (2023.02); H10K 59/122 (2023.02)

(58) Field of Classification Search
CPC ............. H01L 51/5088; H01L 27/3246; H01L 51/5056
See application file for complete search history.

(56) References Cited

U.S. PATENT DOCUMENTS

| | | | |
|---|---|---|---|
| 2012/0326201 A1* | 12/2012 | Ohnuma | ................ H10K 71/60 438/22 |
| 2016/0118449 A1 | 4/2016 | Sato et al. | |
| 2016/0155785 A1 | 6/2016 | Sato | |
| 2018/0190731 A1* | 7/2018 | Park | ..................... H01L 27/3246 |
| 2021/0408163 A1* | 12/2021 | Heo | ..................... H01L 27/3246 |
| 2022/0231250 A1* | 7/2022 | Aoki | ....................... H10K 50/17 |

FOREIGN PATENT DOCUMENTS

| | | | |
|---|---|---|---|
| JP | 2016-085913 A | | 5/2016 |
| JP | 2016-103395 A | | 6/2016 |
| KR | 20120072726 A | * | 7/2012 |

* cited by examiner

*Primary Examiner* — Peter Bradford
(74) *Attorney, Agent, or Firm* — Michael Best & Friedrich LLP

(57) ABSTRACT

A display device includes: light-emitting regions different in luminescent colors and including luminescent layers separated for each of the luminescent colors; a low-threshold layer lower in threshold voltage than any one of the luminescent layers included in a pair of different-color light-emitting regions included in the light-emitting regions, different in the luminescent colors, and adjacent to each other; a continuous layer under the luminescent layers and the low-threshold layer, including first areas and a second area continuously, the first areas being in contact with the respective light-emitting regions, the second area being in contact with the low-threshold layer; pixel electrodes under the continuous layer, overlapping with the respective light-emitting regions; and a counter electrode over the luminescent layers and the low-threshold layer, being opposed to the pixel electrodes. The low-threshold layer is between the pair of different-color light-emitting regions.

14 Claims, 8 Drawing Sheets

DISPLAY DEVICE HAVING ORGANIC LIGHT EMITTING DIODE WITH LOW THRESHOLD LAYER

CROSS-REFERENCE TO RELATED APPLICATION

The present application claims priority from Japanese patent application JP 2020-170394 filed on Oct. 8, 2020, the contents of which are hereby incorporated by reference into this application.

BACKGROUND

1. Field

This disclosure relates to a display device.

2. Description of the Related Art

A display device has come to have more pixels with adjacent pixels being closer. An organic electroluminescent display having a luminescent layer separated for each pixel may have a continuous layer (e.g., hole transport layer) over all pixels. Such a continuous layer, which is ideal for ensuring productivity, may permit an adjacent luminescent layer to emit light due to a leakage current (JP 2016-103395A, JP 2016-85913A). This is remarkable at low gradation and is a factor of color shift of a single color or a white color.

Materials of the luminescent layer is selected in consideration of characteristics for each luminescent color. Therefore, threshold voltages at which a current starts to flow to the luminescent layer vary depending on luminescent colors. For countermeasures against the leakage current, an equivalent threshold voltage for any luminescent layer is ideal but leads to little room for material selection.

SUMMARY

This disclosure aims at reducing leakage current.

A display device includes: a plurality of light-emitting regions different in luminescent colors, the plurality of light-emitting regions including a plurality of luminescent layers separated for each of the luminescent colors; a low-threshold layer lower, in threshold voltage at which a current flowing therein begins to increase exponentially, than any one of the plurality of luminescent layers included in a pair of different-color light-emitting regions, the pair of different-color light-emitting regions being included in the plurality of light-emitting regions, the pair of different-color light-emitting regions being different in the luminescent colors and being adjacent to each other; a continuous layer under the plurality of luminescent layers and the low-threshold layer, the continuous layer including a plurality of first areas and a second area continuously, the plurality of first areas being in contact with the respective plurality of light-emitting regions, the second area being in contact with the low-threshold layer; a plurality of pixel electrodes under the continuous layer, the plurality of pixel electrodes overlapping with the respective plurality of light-emitting regions; and a counter electrode over the plurality of luminescent layers and the low-threshold layer, the counter electrode being opposed to the plurality of pixel electrodes. The low-threshold layer is between the pair of different-color light-emitting regions.

A current is drawn from the continuous layer to the low-threshold layer, thereby reducing the leakage current between the pair of different-color light-emitting regions.

DETAILED DESCRIPTION

Figure 1:
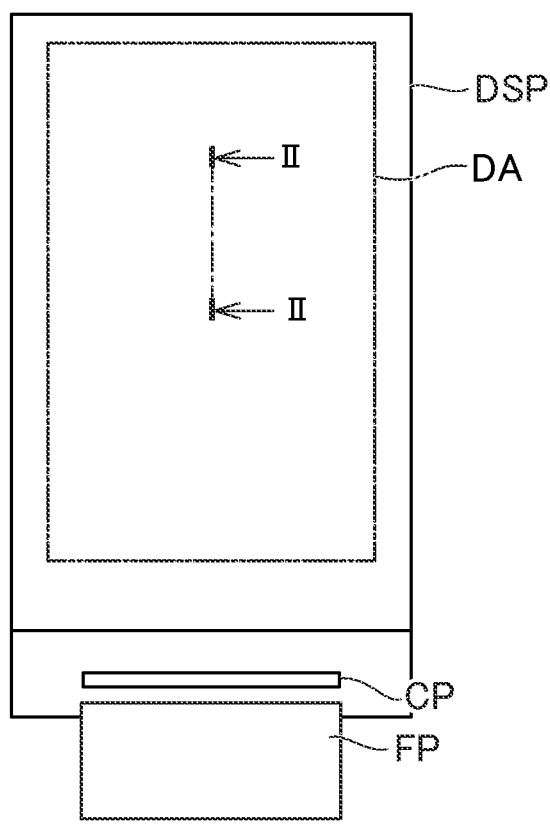
FIG. 1 is a plan view of a display device according to a first embodiment.

Hereinafter, some embodiments will be described with reference to the drawings. Here, the invention can be embodied according to various aspects within the scope of the invention without departing from the gist of the invention and is not construed as being limited to the content described in the embodiments exemplified below.

The drawings are further schematically illustrated in widths, thickness, shapes, and the like of units than actual forms to further clarify description in some cases but are merely examples and do not limit interpretation of the invention. In the present specification and the drawings, the same reference numerals are given to elements having the same functions described in the previously described drawings, and the repeated description will be omitted.

Further, in the detailed description, "on" or "under" in definition of positional relations of certain constituents, and other constituents includes not only a case in which a constituent is located just on or just under a certain constituent but also a case in which another constituent is interposed between constituents unless otherwise mentioned.

First Embodiment

FIG. 1 is a plan view of a display device according to a first embodiment. The display device includes a display DSP. The display DSP is flexible and foldable outside the display area DA. An integrated circuit chip CP configured to drive elements for displaying images is mounted on the display DSP. A flexible printed circuit board FP is connected to the display DSP.

The display device is, for example, an organic electroluminescent display device. The display device has a display area DA in which an image is displayed. In the display area DA, for example, some color unit pixels (sub-pixels) consisting of red, green, and blue are combined to form a full-color pixel, and a full-color image is displayed.

Figure 2:
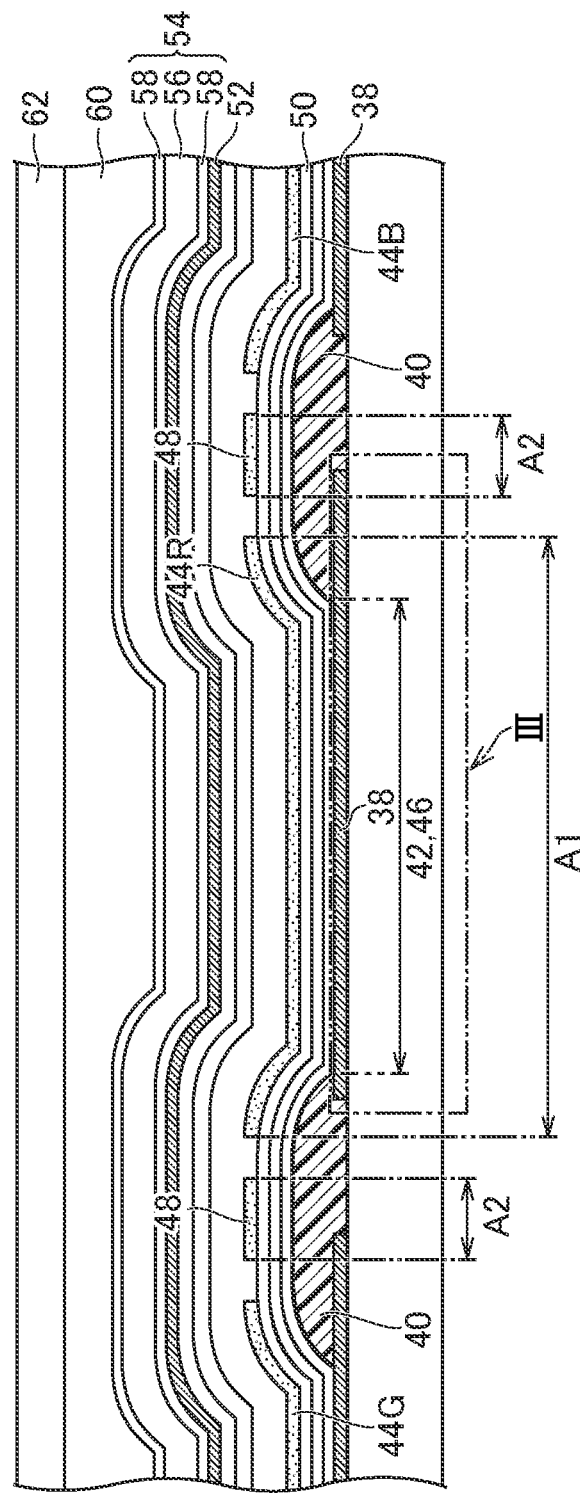
FIG. 2 is a II-II cross-sectional view of the display device shown in FIG. 1.
Figure 3:
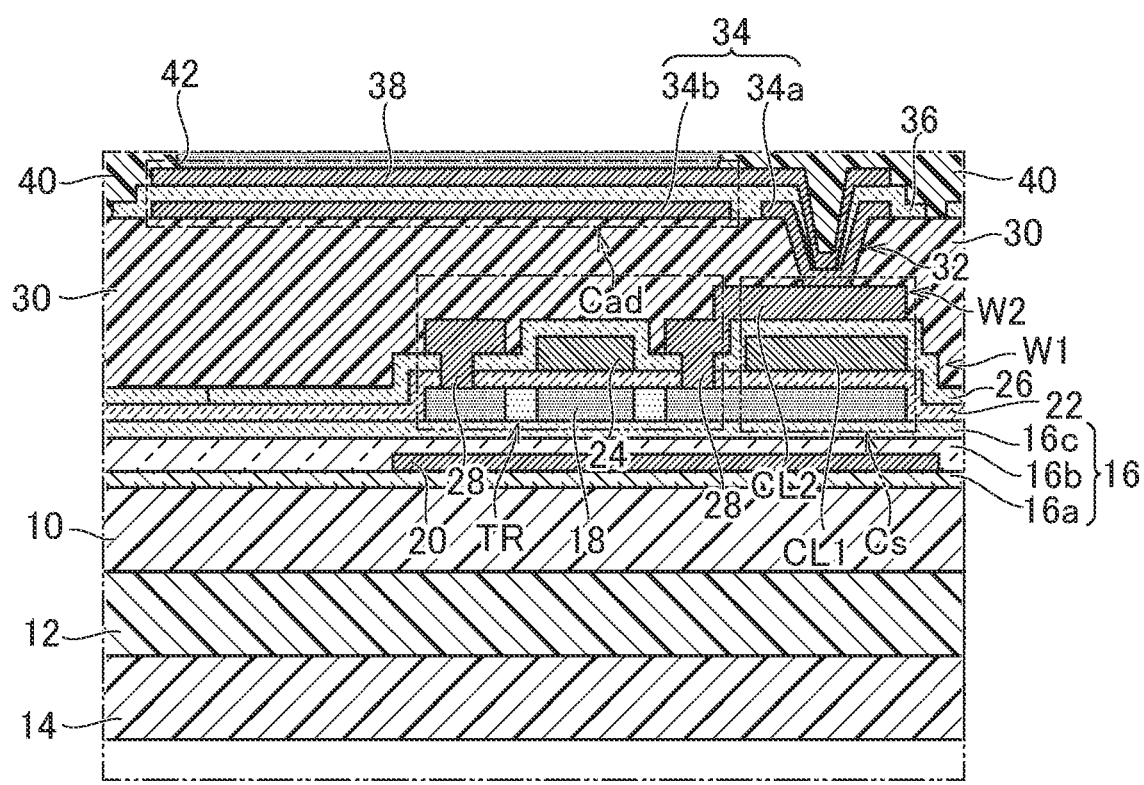
FIG. 3 is an enlarged view of a portion III shown in FIG. 2.

FIG. 2 is a II-II cross-sectional view of the display device shown in FIG. 1. FIG. 3 is an enlarged view of a portion III shown in FIG. 2. The resin substrate 10 shown in FIG. 3 is made of polyimide. However, any other resin material may be used as long as it is a base material having sufficient flexibility for forming a sheet display or a flexible display. A reinforcing film 14 is adhered to a back of the resin substrate 10 with a pressure-sensitive adhesive 12. Here, the resin substrate 10 is assumed to be used as a sheet display, for example, although not particularly limited thereto, and a glass substrate or a metal substrate having an insulating surface may be substituted.

A barrier inorganic film 16 (undercoat layer) is laminated on the resin substrate 10. The barrier inorganic film 16 has a three-layer laminated structure consisting of a first inorganic film (e.g., silicon oxide film) 16a, a second inorganic film (e.g., silicon nitride film) 16b, and a third inorganic film (e.g., silicon oxide film) 16c. The lowest first inorganic film 16a is for improving adhesion to the resin substrate 10, the middle second inorganic film 16b serves as a block film against moisture and impurities from the outside, the uppermost third inorganic film 16c serves as a block film to prevent hydrogen atoms contained in the second inorganic film 16b from diffusing toward the semiconductor layer 18 of the thin film transistor TR, although this structure is changeable, another layer may be further laminated, or a single layer or a double layer lamination is applicable.

An additional film 20 may be formed at a position for forming the thin film transistor TR. The additional film 20 can suppress change in characteristics of the thin film transistor TR possibly due to penetration of light from the back of the channel, or can provide a predetermined potential by being formed from a conductive material to give a back gate effect to the thin film transistor TR. Here, after the first inorganic film 16a is formed, the additional film 20 is formed in an island shape in accordance with the position for forming the thin film transistor TR, and then the second inorganic film 16b and the third inorganic film 16c are laminated, so that the additional film 20 is sealed in the barrier inorganic film 16; instead, the additional film 20 may be formed first on the resin substrate 10, and then the barrier inorganic film 16 may be formed.

The thin film transistor TR is formed on the barrier inorganic film 16. A polysilicon thin film transistor is exemplified here, and only an N-channel transistor is shown, but a P-channel transistor may also be formed. The semiconductor layer 18 of the thin film transistor TR has a structure in which a low concentration impurity region or an intrinsic semiconductor region is provided between a channel region and a source/drain region. A silicon oxide film is used here as a gate insulating film 22. A gate electrode 24 is part of a first wiring layer W1 formed of MoW. The first wiring layer W1 has a first holding capacitance line CL1 in addition to the gate electrode 24. There is a portion of a holding capacitor Cs between the first holding capacitance line CL1 and the semiconductor layer 18 (source/drain region), via the gate insulating film 22.

There is an interlayer insulating film 26 (silicon oxide film, silicon nitride film) laminated on the gate electrode 24. There is a second wiring layer W2, including a portion serving as a source/drain electrode 28, on the interlayer insulating film 26. Here, a three-layer laminated structure of Ti, Al, and Ti is employed. The first holding capacitance line CL1 (part of the first wiring layer W1) and the second holding capacitance line CL2 (part of the second wiring layer W2), via the interlayer insulating film 26, constitute another part of the holding capacitor Cs.

A flattening organic film 30 is provided to cover the source/drain electrodes 28. The flattening organic film 30 is formed from resins such as photosensitive acrylic due to superiority in surface flatness to inorganic insulating materials possibly formed by chemical vapor deposition (CVD).

The flattening organic film 30 is removed at the pixel contact portion 32, and a transparent conductive film 34 such as indium tin oxide (ITO) is formed thereon. The transparent conductive film 34 includes a first transparent conductive film 34a and a second transparent conductive film 34b separated from each other.

The second wiring layer W2, a surface of which is exposed by removal of the flattening organic film 30, is covered with the first transparent conductive film 34a. An inorganic insulating film 36 (e.g., silicon nitride film) is provided on the flattening organic film 30 to cover the first transparent conductive film 34a. The inorganic insulating film 36 has an opening at the pixel contact portion 32, and a pixel electrode 38 is laminated to be electrically continuous to the source/drain electrode 28 through the opening. The pixel electrode 38 is formed as a reflective electrode, and has a three-layer laminated structure of an indium zinc oxide film, an Ag film, and an indium zinc oxide film. Here, an indium tin oxide film may be used instead of the indium zinc oxide film. The pixel electrode 38 extends laterally from the pixel contact portion 32 and to above the thin film transistor TR.

The second transparent conductive film 34b is adjacent to the pixel contact portion 32, and is disposed below the pixel electrode 38 (further below the inorganic insulating film 36). The second transparent conductive film 34b, the inorganic insulating film 36, and the pixel electrode 38 overlap with each other and constitute a first additional capacitor Cad.

The display device has an insulating layer 40 covering each end portion of the pixel electrodes 38. The insulating layer 40 is also referred to as a bank. The insulating layer 40 is formed on the flattening organic film 30 and above the pixel contact portion 32, for example, serving as a partition wall of adjacent pixel regions. As the insulating layer 40, photosensitive acrylic may be used similarly to the flattening organic film 30.

The flattening organic film 30 and the insulating layer 40 are in contact with each other through an opening provided in the inorganic insulating film 36 between them. Therefore, moisture and gas desorbed from the flattening organic film 30 can be extracted through the insulating layer 40 during heat treatment after the formation of the insulating layer 40.

As shown in FIG. 2, the insulating layer 40 has openings 42 corresponding to the respective pixel electrodes 38. Each opening 42 should have an end in a gently tapered shape. A steep shape of the opening 42 at its end would cause poor coverage of the layer formed thereon.

The display device includes a plurality of luminescent layers 44R, 44G, 44B. The luminescent layers 44R, 44G, 44B are separated for each of the luminescent colors. For example, the luminescent color of the luminescent layer 44R is red, the luminescent color of the luminescent layer 44G is green, and the luminescent color of the luminescent layer 44B is blue. The luminescent layers 44R, 44G, 44B are arranged without overlapping with each other, but may overlap with each other at their ends. The ends of the luminescent layers 44R, 44G, 44B overlap with the insulating layer 40.

The luminescent layers 44R, 44G, 44B include a plurality of light-emitting regions 46. For example, each of the luminescent layers 44R, 44G, 44B includes a corresponding one of the light-emitting regions 46. Alternatively, each of the luminescent layers 44R, 44G, 44B may include two or more light-emitting regions 46. The light-emitting regions 46 overlap with the respective plurality of pixel electrodes 38. The light-emitting regions 46 are directly above respective openings 42 in the insulating layer 40.

The display has a low-threshold layer 48. The low-threshold layer 48 is lower, in threshold voltage at which a current flowing therein begins to increase exponentially, than any of the luminescent layers 44R, 44G, 44B. The low-threshold layer 48 is made of a semiconductor material or an organic semiconductor material. The semiconductor material is a dopant contained in any one of the luminescent layers 44R, 44G, 44B (e.g., luminescent layer 44G in green luminescent color). At least part of energy of a current flowing through the low-threshold layer 48 is consumed by being converted into light or heat. The low-threshold layer 48 should have a low light emission efficiency.

The low-threshold layer 48 is disposed to overlap with none of the luminescent layers 44R, 44G, 44B. Alternatively, the low-threshold layer 48 may overlap with at least one layer of the luminescent layers 44R, 44G, 44B, below it (closer to the pixel electrode 38) rather than above it. The low-threshold layer 48 is above the insulating layer 40.

The display has a continuous layer 50. The continuous layer 50 has a property of allowing carriers to move. For example, the continuous layer 50 as an electron block layer can block electrons but allows holes to move. Alternatively, the continuous layer 50 may be a hole transport layer. The continuous layer 50 is above the pixel electrodes 38 and below the luminescent layers 44R, 44G, 44B (light-emitting regions 46). The continuous layer 50 also overlaps with the insulating layer 40.

The continuous layer 50 includes a plurality of first areas A1 below the luminescent layers 44R, 44G, 44B. The first areas A1 are in contact with the respective plurality of light-emitting regions 46. Accordingly, carriers flow into the luminescent layer 44R (or 44G, 44B) through the first area A1. The continuous layer 50 includes a second area A2 below the low-threshold layer 48. The second area A2 is in contact with the low-threshold layer 48. Accordingly, carriers flow into the low-threshold layer 48 through the second area A2.

The first areas A1 and the second area A2 are continuous. That is, the second area A2 is between the adjacent first areas A1. The low-threshold layer 48 is lower in the threshold voltage than any one of the luminescent layers 44R, 44G, 44B, whereby carriers moving between the adjacent first areas A1 are likely to be injected into the low-threshold layer 48.

The continuous layer 50 is an uppermost layer of the multiple layers overlapping. The multiple layers may include an electron blocking layer (continuous layer 50), a hole transporting layer, and a hole injecting layer. Other layers (e.g., hole blocking layer, electron transporting layer, electron injecting layer) are laminated on the luminescent layers 44R, 44G, 44B and the low-threshold layer 48.

The display device has a counter electrode 52. The counter electrode 52 is opposed to the pixel electrodes 38 above the luminescent layers 44R, 44G, 44B and the low-threshold layer 48. A sealing layer 54 is formed on the counter electrode 52. The sealing layer 54 has a function of preventing moisture from entering the luminescent layers 44R, 44G, 44B and multiple layers above and below them from the outside, and is required to have a high gas-barrier property. The sealing layer 54 has a laminated structure of an organic film 56 and a pair of inorganic films 58 (e.g., silicon nitride film) sandwiching it from above and below it. The pair of inorganic films 58 overlap with and are in contact with each other around the organic film 56. A protective layer 60 and a polarizing plate 62 (e.g., circular polarizing plate) are laminated on the sealing layer 54.

Figure 4:
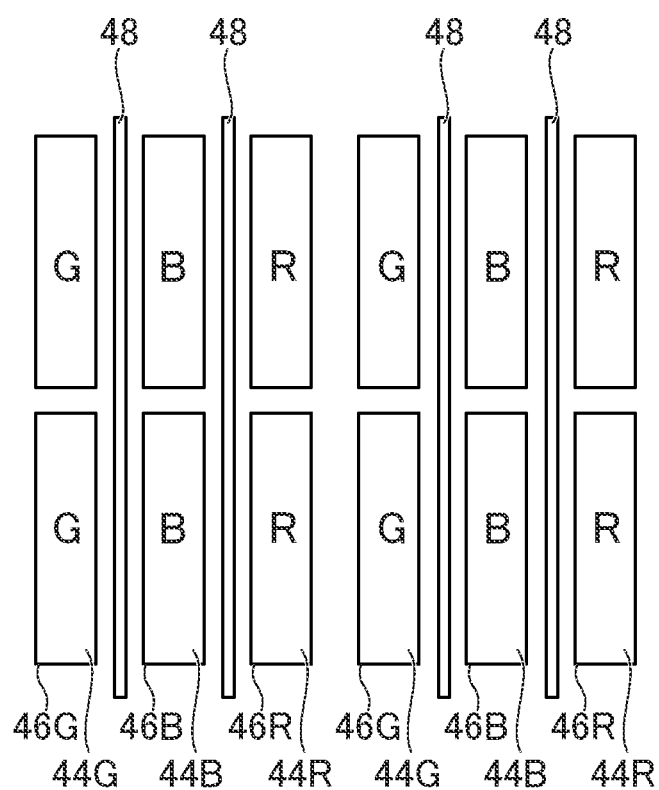
FIG. 4 is a plan view of a pixel arrangement of the display device according to the first embodiment.

FIG. 4 is a plan view of a pixel arrangement of the display device according to the first embodiment. In this embodiment, the pixel arrangement is a stripe arrangement. The light-emitting regions 46R (or 46G, 46B) of the same light-emitting color R (or G, B) are arranged in a longitudinal direction. The light-emitting regions 46R, 46G, 46B of the different luminescent colors R, G, B are alternately arranged in a horizontal direction. The light-emitting regions 46R, 46G, 46B include a pair of different-color light-emitting regions that are different in the luminescent colors R, G, B and are adjacent to each other. The pair of different-color light-emitting regions are, for example, a pair of light-emitting regions 46B, 46R, a pair of light-emitting regions 46B, 46G, or a pair of light-emitting regions 46R, 46G.

The luminescent layers 44R, 44G, 44B include a pair of different-color luminescent layers that are adjacent to each other and are different in the threshold voltages depending on the luminescent colors R, G, B. The pair of different-color luminescent layers are, for example, a pair of luminescent layers 44B, 44R, a pair of luminescent layers 44B, 44G, or a pair of luminescent layers 44R, 44G.

The low-threshold layer 48 is at least between the pair of different-color light-emitting regions (a pair of light-emitting regions 46B, 46R or a pair of light-emitting regions 46B, 46G) corresponding to the pair of different-color luminescent layers (a pair of luminescent layers 44B, 44R or a pair of luminescent layers 44B, 44G) that make the largest difference in the threshold voltage.

The low-threshold layer 48 is also between the pair of different-color light-emitting regions (a pair of light-emitting regions 46B, 46R or a pair of light-emitting regions 46B, 46G) corresponding to the pair of different-color luminescent layers (a pair of luminescent layers 44B, 44R or a pair of luminescent layers 44B, 44G) that make the second largest difference in the threshold voltage.

The low-threshold layer 48 is located in a position that avoids an area between the pair of different-color light-emitting regions (a pair of light-emitting region 46R, 46G) corresponding to the pair of different-color luminescent layers that make the smallest difference in the threshold voltage.

This embodiment can reduce the leakage current between the pair of different-color light-emitting regions (a pair of luminescent layers 44B, 44R, a pair of luminescent layers 44B, 44G), due to the current flowing from the continuous layer 50 to the low-threshold layer 48.

Second Embodiment

Figure 5:
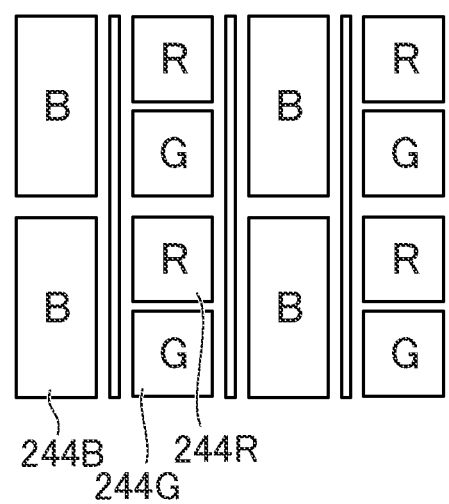
FIG. 5 is a plan view of a pixel arrangement of a display device according to a second embodiment.

FIG. 5 is a plan view of a pixel arrangement of a display device according to a second embodiment. In this embodiment, a group of luminescent layers 244B that are highest in the threshold voltage depending on the luminescent colors R, G, B are arranged in stripes. Other luminescent layers 244R, 244G are alternately arranged in a longitudinal direction of the stripes. Except for this point, the contents described in the first embodiment are applicable to this embodiment.

Third Embodiment

Figure 6:
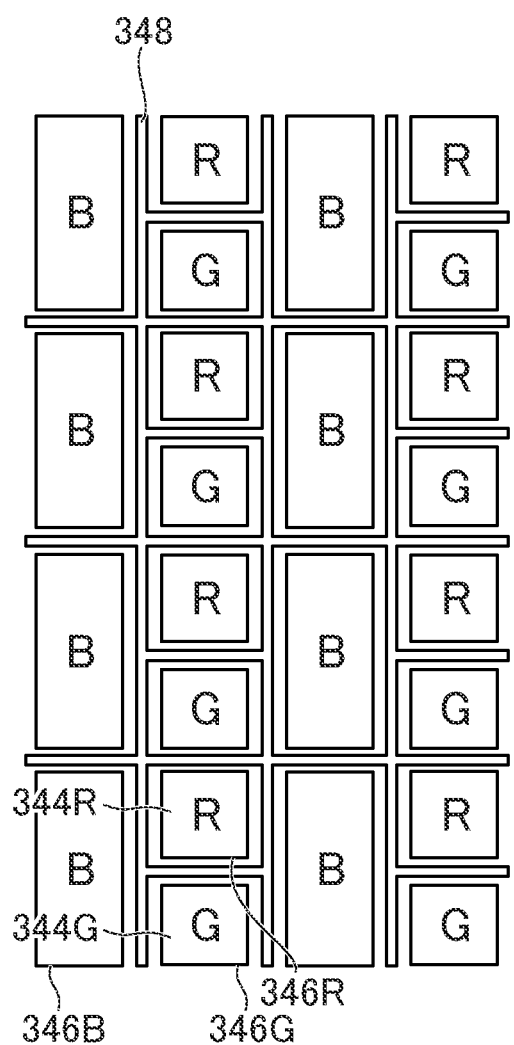
FIG. 6 is a plan view of a pixel arrangement of a display device according to a third embodiment.

FIG. 6 is a plan view of a pixel arrangement of a display device according to a third embodiment. This embodiment is the same as the second embodiment in the pixel arrangement, but the low-threshold layers 348 surround each of all the light-emitting regions 346R, 346G, 346B. The low-threshold layer 348 is also between the pair of different-color light-emitting regions (a pair of light-emitting regions 346R, 346G) corresponding to the pair of different-color luminescent layers (a pair of luminescent layers 344R, 344G) that make the smallest difference in the threshold voltage.

Fourth Embodiment

Figure 7:
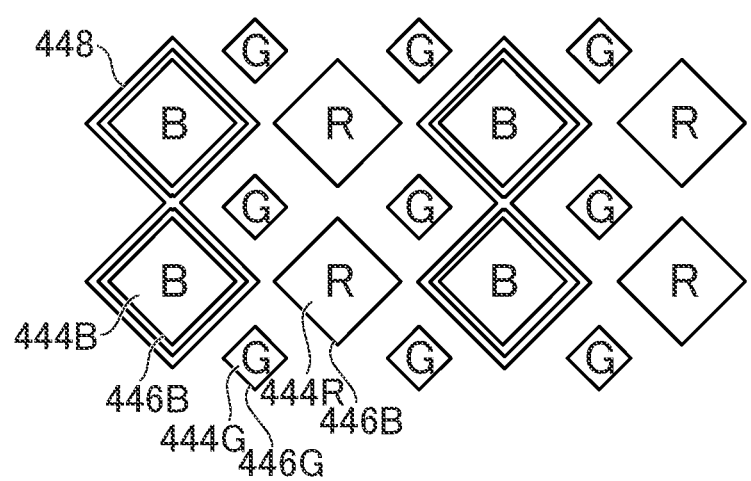
FIG. 7 is a plan view of a pixel arrangement of a display device according to a fourth embodiment.

FIG. 7 is a plan view of a pixel arrangement of a display device according to a fourth embodiment. In this embodiment, the light-emitting regions 446R, 446G, 446B are different in size and the luminescent layers 444R, 444G, 444B are different in size, depending on the luminescent colors R, G, B. Further, the light-emitting regions 446R, 446G, 446B each have a planar rhombic shape based on an arrangement direction. The low-threshold layer 448 surrounds each of a group of light-emitting regions 446B of a group of luminescent layers 444B that are highest in the threshold voltage depending on the luminescent colors R, G, B.

Fifth Embodiment

Figure 8:
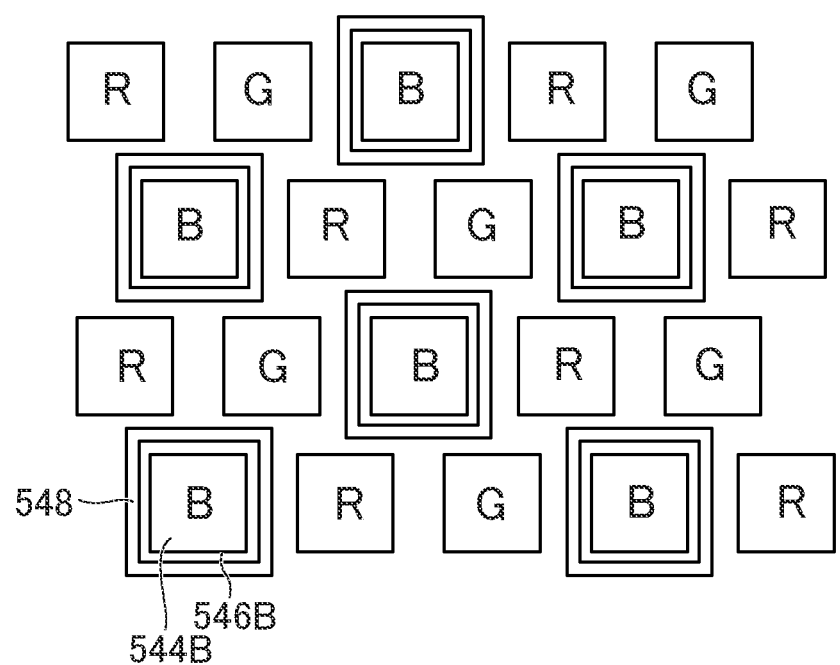
FIG. 8 is a plan view of a pixel arrangement of a display device according to a fifth embodiment.

FIG. 8 is a plan view of a pixel arrangement of a display device according to a fifth embodiment. In this embodiment, the pixel arrangement is a delta arrangement. The low-threshold layer 548 surrounds each of a pair of light-emitting regions 546B of a pair of luminescent layers 544B that are highest in the threshold voltage depending on the luminescent colors R, G, B.

The embodiments described above are not limited and different variations are possible. The structures explained in the embodiments may be replaced with substantially the same structures and other structures that can achieve the same effect or the same objective.

What is claimed is:

1. A display device comprising:
a plurality of light-emitting regions different in luminescent colors, the plurality of light-emitting regions including a plurality of luminescent layers separated for each of the luminescent colors;
a low-threshold layer lower, in threshold voltage at which a current flowing therein begins to increase exponentially, than any one of the plurality of luminescent layers included in a pair of different-color light-emitting regions, the pair of different-color light-emitting regions being included in the plurality of light-emitting regions, the pair of different-color light-emitting regions being different in the luminescent colors and being adjacent to each other;
a continuous layer under the plurality of luminescent layers and the low-threshold layer, wherein the continuous layer is provided in a plurality of first areas and a second area continuously, the plurality of first areas being in contact with the respective plurality of light-emitting regions, the second area being in contact with the low-threshold layer;
a plurality of pixel electrodes under the continuous layer, the plurality of pixel electrodes overlapping with the respective plurality of light-emitting regions; and
a counter electrode over the plurality of luminescent layers and the low-threshold layer, the counter electrode being opposed to the plurality of pixel electrodes, wherein the low-threshold layer is between the pair of different-color light-emitting regions.

2. The display device according to claim 1, wherein each of the plurality of luminescent layers includes a corresponding one of the plurality of light-emitting regions.

3. The display device according to claim 1, wherein the plurality of luminescent layers do not overlap with each other.

4. The display device according to claim 1, wherein the low-threshold layer overlaps with none of the plurality of luminescent layers.

5. The display device according to claim 1, wherein the low-threshold layer includes a semiconductor material or an organic semiconductor material.

6. The display device according to claim 5, wherein the semiconductor material is a dopant contained in any one of the plurality of luminescent layers.

7. The display device according to claim 1, wherein the continuous layer is an uppermost layer of multiple layers overlapping.

8. The display device according to claim 1, further comprising an insulating layer covering end portions of the plurality of pixel electrodes, the insulating layer being provided between the end portions of the plurality of pixel electrodes and the continuous layer, wherein
the insulating layer has a plurality of openings exposing partial upper surfaces of the respective plurality of pixel electrodes, and
the plurality of light-emitting regions are directly above the respective plurality of openings.

9. The display device according to claim 8, wherein the low-threshold layer is above the insulating layer.

10. The display device according to claim 8, wherein the plurality of luminescent layers at least partially overlap with the insulating layer.

11. The display device according to claim 1, wherein
the plurality of luminescent layers includes a pair of different-color luminescent layers, the pair of different-color luminescent layers being different in the threshold voltage depending on the luminescent colors, the pair of different-color luminescent layers being adjacent to each other, and
the low-threshold layer is between the pair of different-color light-emitting regions corresponding to the pair of different-color luminescent layers that make the largest difference in the threshold voltage.

12. The display device according to claim 11, wherein the low-threshold layer is also between the pair of different-color light-emitting regions corresponding to the pair of different-color luminescent layers that make the second largest difference in the threshold voltage.

13. The display device according to claim 11, wherein the low-threshold layer is located in a position that avoids an area between the pair of different-color light-emitting regions corresponding to the pair of different-color luminescent layers that make the smallest difference in the threshold voltage.

14. The display device according to claim 11, wherein
the plurality of luminescent layers include a group of luminescent layers that are highest in the threshold voltage that varies depending on the luminescent colors,
the plurality of light-emitting regions include a group of light-emitting regions corresponding to the group of luminescent layers, and
the low-threshold layer surrounds each of the group of light-emitting regions.

* * * * *